(12) United States Patent
Lee et al.

(10) Patent No.: US 9,478,265 B2
(45) Date of Patent: Oct. 25, 2016

(54) SEMICONDUCTOR MEMORY DEVICE

(71) Applicant: SK hynix Inc., Gyeonggi-do (KR)

(72) Inventors: Sung-Yub Lee, Gyeonggi-do (KR); Sung-Soo Chi, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/698,510

(22) Filed: Apr. 28, 2015

(65) Prior Publication Data

US 2016/0163364 A1    Jun. 9, 2016

(30) Foreign Application Priority Data

Dec. 8, 2014 (KR) .......................... 10-2014-0174923

(51) Int. Cl.
| | |
|---|---|
| *G11C 7/00* | (2006.01) |
| *G11C 7/12* | (2006.01) |
| *G11C 7/06* | (2006.01) |
| *G11C 11/4074* | (2006.01) |
| *G11C 11/4091* | (2006.01) |

(52) U.S. Cl.
CPC . *G11C 7/12* (2013.01); *G11C 7/06* (2013.01); *G11C 11/4074* (2013.01); *G11C 11/4091* (2013.01)

(58) Field of Classification Search
CPC ..... G11C 8/08; G11C 5/145; G11C 11/4091; G11C 7/065; G11C 7/1078; G11C 7/1084; G11C 7/1057; G11C 11/41; G11C 11/419

USPC ..................... 365/189.11, 205, 207
See application file for complete search history.

(56) References Cited

U.S. PATENT DOCUMENTS

2011/0075491 A1*   3/2011   Yun ....................... G11C 5/147
                                                                365/189.11

FOREIGN PATENT DOCUMENTS

KR      1020150144171      12/2015

* cited by examiner

*Primary Examiner* — Huan Hoang
(74) *Attorney, Agent, or Firm* — IP & T Group LLP

(57) ABSTRACT

Disclosed is a semiconductor memory device including: a sense amplifier capable of sensing and amplifying data loaded on a data-line pair based on a pull-up driving voltage and a pull-down driving voltage; a pull-up driving unit capable of supplying a first voltage as the pull-up driving voltage for first and third active sections of an active mode, and supplying a second voltage having a voltage level lower than the first voltage as the pull-up driving voltage for a second active section of the active mode, between the first and third active sections of the active mode; and a pull-down driving unit capable of supplying a third voltage as the pull-down driving voltage for the first to third active sections of the active mode and for an initial section of a precharge mode after the active mode.

20 Claims, 9 Drawing Sheets

SEMICONDUCTOR MEMORY DEVICE

CROSS-REFERENCE TO RELATED APPLICATIONS

The present application claims priority of Korean Patent Application No. 10-2014-0174923 filed on Dec. 8, 2014, which is incorporated herein by reference in its entirety.

BACKGROUND

1. Field

Exemplary embodiments of the present invention relate to a semiconductor design technology and, more particularly, to a semiconductor memory device including a sense amplifier.

2. Description of the Related Art

A Dynamic Random Access Memory (DRAM) device is a typical volatile semiconductor memory device. A DRAM memory cell has a cell transistor and a cell capacitor. The cell transistor serves to select the cell capacitor, and the cell capacitor serves to store electric charges that correspond to data.

Since there is unintentional leakage of electric current in and out of the cell capacitors, the memory cell charges need to be periodically restored. This operation of restoring the charge in the cell capacitors is referred to as a refresh operation. Refresh operations require repeatedly performing active mode and precharge mode operations at predetermined periods. A more detailed description of refresh operations is as follows. In the active mode, as a memory cell is selected and a bit-line sense amplifier is enabled, the bit-line sense amplifier senses and amplifies data transferred from the selected memory cell and then returns the amplified data back to the memory cell. Then, in the precharge mode, the bit-line sense amplifier is disabled and the memory cells are unselected. This whole process allows the data stored in the memory cells to be maintained.

However, when current leakage increases, the length of time which memory cells may reliably maintain data that is stored in the cell capacitors is shortened. Therefore, it would be desirable to have new technologies to help reduce leakage current and improve data reliability.

SUMMARY

Various embodiments are directed to a semiconductor memory device having an improved data retention time for data of a memory cell.

Also, various embodiments are directed to a semiconductor memory device in which a write time required to transfer write data to a memory cell is improved, a data retention time of a memory cell is improved, and a precharge time required to precharge a corresponding data-line pair in a precharge mode is improved.

In an embodiment, a semiconductor memory device may include: a sense amplifier capable of sensing and amplifying data loaded on a data-line pair based on a pull-up driving voltage and a pull-down driving voltage; a pull-up driving unit capable of supplying a first voltage as the pull-up driving voltage for first and third active sections of an active mode, and supplying a second voltage having a voltage level lower than the first voltage as the pull-up driving voltage for a second active section of the active mode, between the first and third active sections of the active mode; and a pull-down driving unit capable of supplying a third voltage as the pull-down driving voltage for the first to third active sections of the active mode and for an initial section of a precharge mode after the active mode.

The pull-down driving unit may include: a pull-down controller capable of controlling an activation section of a pull-down driving signal to be activated for the first to third active sections of the active mode and for the initial section of the precharge mode; and a pull-down driving module capable of supplying the third voltage as the pull-down driving voltage in response to the pull-down driving signal.

The pull-down driving unit may include: a first pull-down driving module capable of supplying the third voltage as the pull-down driving voltage for the first to third active sections of the active mode; and a second pull-down driving module capable of supplying the third voltage as the pull-down driving voltage for the initial section of the precharge mode.

The pull-up driving unit may include: a first pall-up driving module capable of supplying the first voltage as the pull-up driving voltage for the first and third active sections of the active mode; and a second pull-up driving module capable of supplying the second voltage as the pull-up driving voltage for the second active section of the active mode.

The semiconductor memory device may further include: a first precharge unit capable of precharging the data-line pair to a precharge voltage for a section of the precharge mode other than the initial section of the precharge mode; and a second precharge unit capable of precharging a pull-up power line through which the pull-up driving voltage is supplied, and a pull-down power line through which the pull-down driving voltage is supplied, to the precharge voltage for the section of the precharge mode other than the initial section of the precharge mode.

The precharge voltage may have a voltage level that is approximately half of the second voltage.

The first voltage may be a power supply voltage supplied from outside, the second voltage is a core voltage generated by lowering the power supply voltage, and the third voltage is a ground voltage.

In an embodiment, a semiconductor memory device may include: a bit-line pair comprising a positive bit-line and a negative bit-line; a memory cell connected to either the positive bit-line and the negative bit-line; a sense amplifier capable of sensing and amplifying data loaded on the bit-line pair based on a pull-up driving voltage and a pull-down driving voltage; a pull-up driving unit capable of supplying a first voltage as the pull-up driving voltage for first and third active sections of the active mode, and supplying a second voltage having a voltage level lower than the first voltage as the pull-up driving voltage for a second active section of the active mode, between the first and third active sections of the active mode; and a pull-down driving unit capable of supplying a third voltage as the pull-down driving voltage for the first to third active sections of the active mode and for an initial section of a precharge mode after the active mode.

The pull-down driving unit may include: a pull-down controller capable of controlling an activation section of a pull-down driving signal to be activated for the first to third active sections of the active mode and for the initial section of the precharge mode; and a pull-down driving module capable of supplying the third voltage as the pull-down driving voltage in response to the pull-down driving signal.

The pull-down driving unit may include: a first pull-down driving module capable of supplying the third voltage as the pull-down driving voltage for the first to third active sections of the active mode; and a second pull-down driving module capable of supplying the third voltage as the pull-down driving voltage for the initial section of the precharge mode.

The pull-up driving unit may include: a first pull-up driving module capable of supplying the first voltage as the pull-up driving voltage for the first and third active sections of the active mode; and a second pull-up driving module capable of supplying the second voltage as the pull-up driving voltage for the second active section of the active mode.

The semiconductor memory device may further include: a first precharge unit capable of precharging the bit-line pair to a precharge voltage for a section of the precharge mode other than the initial section of the precharge mode; and a second precharge unit capable of precharging a pull-up power line through which the pull-up driving voltage is supplied, and a pull-down power line through which the pull-down driving voltage is supplied, to the precharge voltage for the section of the precharge mode other than the initial section of the precharge mode.

The precharge voltage may have a voltage level that is approximately half of the second voltage.

The first voltage may be a power supply voltage supplied from outside, the second voltage is a core voltage generated by lowering the power supply voltage, and the third voltage is a ground voltage.

In an embodiment, a semiconductor memory device may include: a sense amplifier capable of sensing and amplifying data loaded on a data-line pair based on a pull-up driving voltage and a pull-down driving voltage; a pull-up driving unit capable of supplying a core voltage as the pull-up driving voltage for an active section, and supplying an over-driving voltage as the pull-up driving voltage one or more times during the active section, just before a precharge section; and a pull-down driving unit capable of supplying a ground voltage as the pull-down driving voltage for the active section and for an initial section of the precharge section.

The pull-down driving unit may include: a pull-down controller capable of controlling an activation section of a pull-down driving signal to be activated for the active section and for the initial section of the precharge section; and a pull-down driving module capable of supplying the ground voltage as the pull-down driving voltage in response to the pull-down driving signal.

The pull-down driving unit may include: a first pull-down driving module capable of supplying the ground voltage as the pull-down driving voltage for the active section; and a second pull-down driving module capable of supplying the ground voltage as the pull-down driving voltage for the initial section of the precharge section.

The pull-up driving unit may include: a first pull-up driving module capable of supplying the over-driving voltage as the pull-up driving voltage for first and third active periods of the active section; and a second pull-up driving module capable of supplying the core voltage as the pull-up driving voltage for a second active period of the active section, between the first and second active periods.

The semiconductor memory device may further include: a first precharge unit capable of precharging the data-line pair to a precharge voltage for a section of the precharge section other than the initial section of the precharge section; and a second precharge unit capable of precharging a pull-up power line through which the pull-up driving voltage is transferred, and a pull-down power line through which the pull-down driving voltage is transferred, to the precharge voltage for the section of the precharge section other than the initial section of the precharge section.

The precharge voltage may have a voltage level that is approximately half of the core voltage.

DETAILED DESCRIPTION

Figure 1:
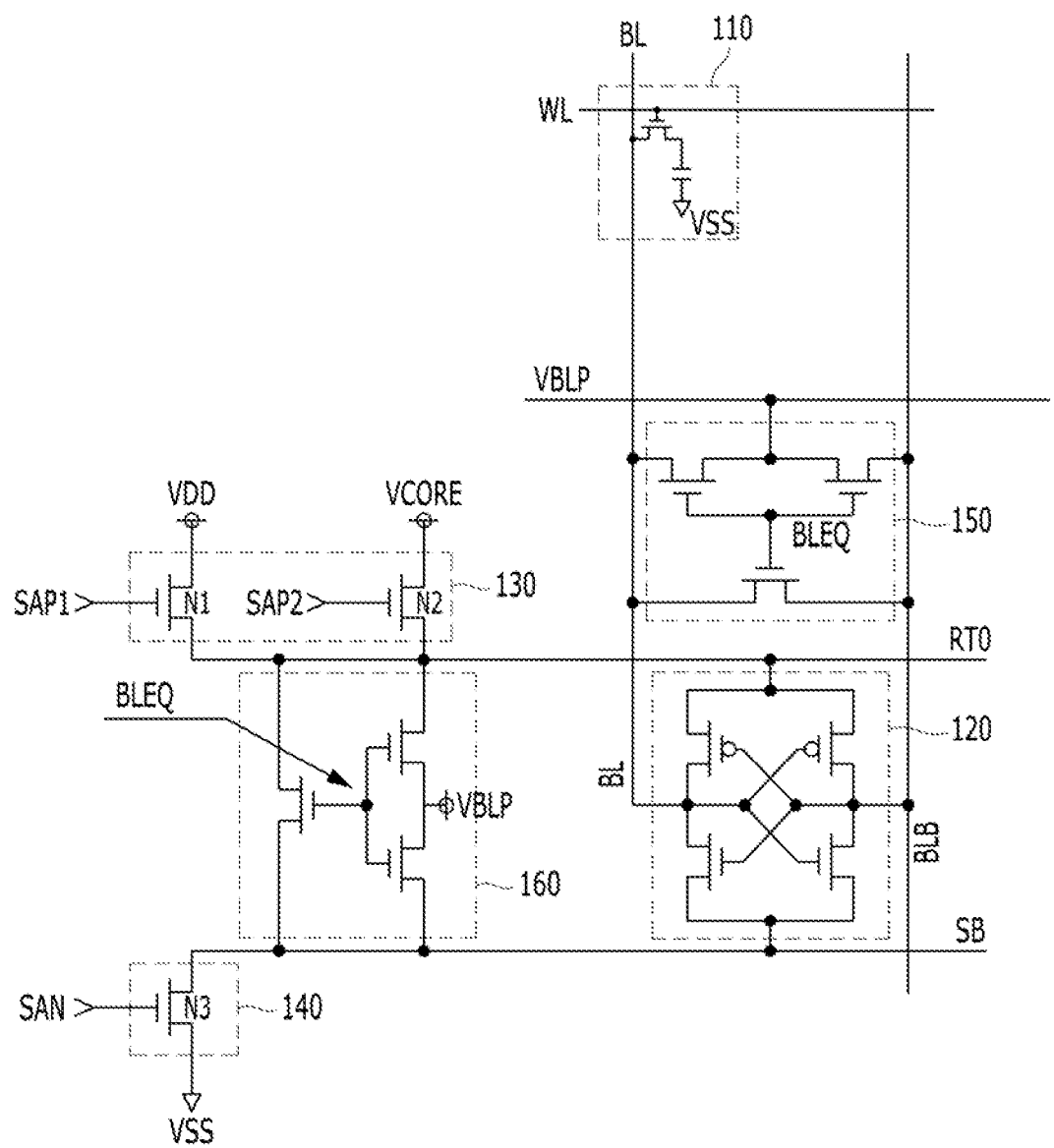
FIG. 1 is a circuit diagram illustrating a semiconductor memory device according to a comparative example of the present invention.

Various embodiments will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

FIG. 1 is a circuit diagram illustrating a semiconductor memory device according to a comparative example of the present invention.

Referring to FIG. 1, the semiconductor memory device includes a bit-line pair BL and BLB including a positive bit-line BL and a negative bit-line BLB a memory cell 110, a sense amplifier 120, a pull-up driving unit 130, a pull-down driving unit 140, a first precharge unit 150, and a second precharge unit 160.

The memory cell 110 may be connected to any one of the positive bit-line BL and the negative bit-line BLB and may include a cell capacitor for storing data and a cell transistor for controlling charge sharing between the cell capacitor and either the positive bit-line BL or the negative bit-line BLB. For example, the cell capacitor may include a capacitor connected between a ground voltage (VSS) terminal and a storage node. The cell transistor may include an NMOS transistor that has a gate connected to a word line WL and a source and a drain connected between the storage node and the positive bit-line BL.

The sense amplifier 120 is configured to include a bit-line sense amplifier (BLSA), which may sense and amplify data loaded on the bit-line pair BL and BLB to a driving voltage supplied through a pull-up power line RTO and a pull-down power line SB. For example, the sense amplifier 120 may include a cross-coupled latch amplifier.

The pull-up driving unit 130 may include a first pull-up driving module N1 and a second pull-up driving module N2. The first pull-up driving module N1 may drive the pull-up power line RTO to a power supply voltage VDD for a first active section and a third active section of an active mode in response to a first pull-up driving signal SAP1, and the second pull-up driving module N2 may drive the pull-up power line RTO to a core voltage VCORE for a second active section of the active mode in response to a second pull-up driving signal SAP2.

The pull-down driving unit 140 may include a pull-down driving module N3. The pull-down driving module N3 may drive the pull-down power line SB to a ground voltage VSS for the first to third active sections of the active mode in response to a pull-down driving signal SAN.

The first precharge unit 150 may precharge the bit-line pair BL and BLB to a bit-line precharge voltage VBLP in a precharge mode in response to an equalization signal BLEQ.

The second precharge unit 160 may precharge the pull-up power line RTO and the pull-down power line SB to the bit-line precharge voltage VBLP in the precharge mode in response to the equalization signal BLEQ.

For reference, the core voltage VCORE and the bit-line precharge voltage VBLP may be internal voltages which are internally generated based on the power supply voltage VDD applied from outside (e.g. an external source, host, or device). For example, the core voltage VCORE may be generated by lowering the power supply voltage VDD, and the bit-line precharge voltage VBLP may be generated by lowering the core voltage VCORE, e.g., VBLP=VCORE/2. Therefore, the bit-line precharge voltage VBLP may have a voltage level lower than the core voltage VCORE, and the core voltage VCORE may have a voltage level lower than the power supply voltage VDD.

Hereinafter, an operation of the semiconductor memory device according to the comparative example of the present invention will be described with reference to FIGS. 2 and 3.

Figure 2:
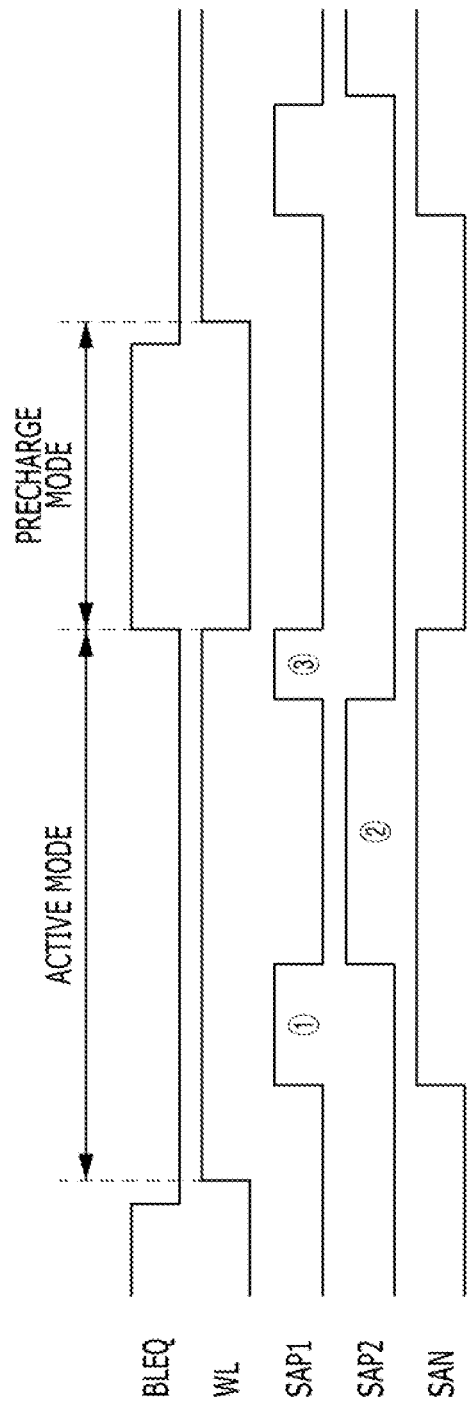
FIG. 2 is a timing diagram showing an operation of the semiconductor memory device illustrated in FIG. 1.
Figure 3:
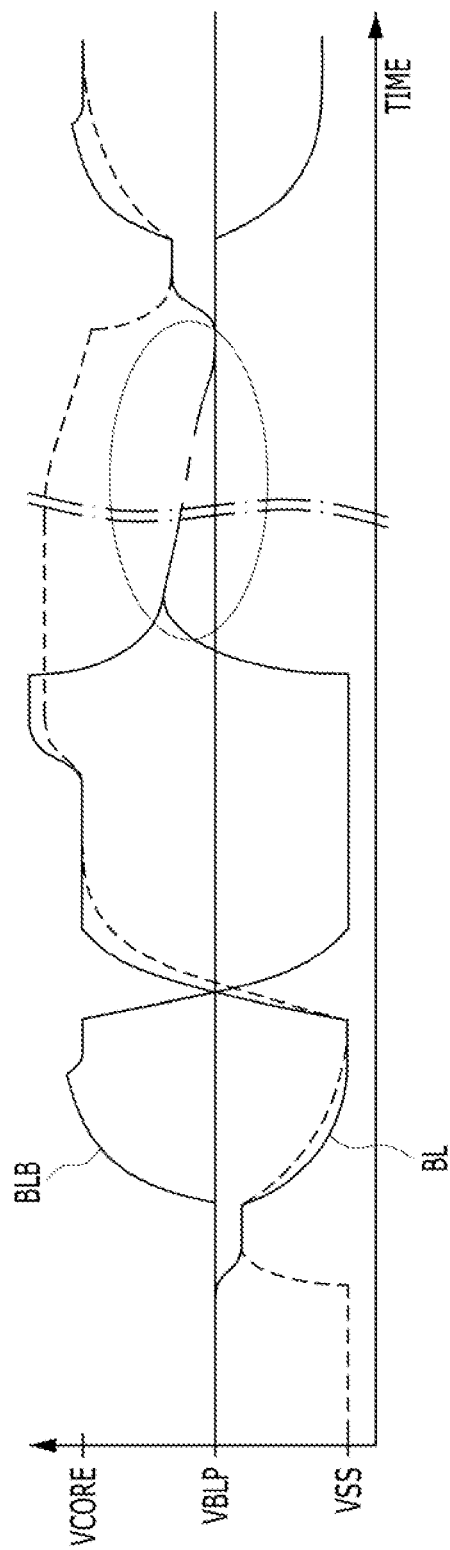
FIG. 3 is a waveform diagram showing a change in a voltage level of a bit-line pair according to the operation of FIG. 2.

FIG. 2 is a timing diagram showing the operation of the semiconductor memory device illustrated in FIG. 1, and FIG. 3 is a waveform diagram showing a change in a voltage level of the bit-line pair BL and BLB according to the operation of FIG. 2.

Referring to FIGS. 2 and 3, the word line WL may be activated to a logic high level for the active mode, and may be inactivated to a logic low level for the precharge mode. For example, the word line WL may be activated in response to an active command (not shown), and may be inactivated in response to a precharge command (not shown).

In addition, the first pull-up driving signal SAP1 may be activated for the first active section ① and the third active section ③ of the active mode, and the second pull-up driving signal SAP2 may be activated for the second active section ② of the active mode. The pull-down driving signal SAN may be activated for the first to third active sections of the active mode. The first pull-up driving signal SAP1, the second pull-up driving signal SAP2 and the pull-down driving signal SAN may be generated by a combination of the active command and the precharge command.

Meanwhile, in the memory cell 110, while the cell transistor is turned on in the active mode, the charge sharing between the positive bit-line BL and the cell capacitor is achieved before the first active section ① of the active mode. When the cell capacitor has stored data of a logic high level, the voltage of the positive bit-line BL increases by a preset voltage level from the voltage level of the bit-line precharge voltage VBLP. Therefore, a preset voltage difference occurs between the positive bit-line BL and the negative bit-line BLB.

In this state, during the first active section ① of the active mode, the first pull-up driving module N1 may drive the pull-up power line RTO to the power supply voltage VDD in response to the first pull-up driving signal SAP1, and the pull-down driving module N3 may drive the pull-down power line SB to the ground voltage VSS in response to the pull-down driving signal SAN. Then, the sense amplifier 120 may sense and amplify data loaded on the bit-line pair BL and BLB based on the power supply voltage VDD and the ground voltage VSS. Such an amplification operation based on the power supply voltage VDD having a higher level than a target voltage, e.g. the core voltage VCORE, for an initial operation section, i.e. for the first active section of the active mode, of the sense amplifier 120 is called an over-driving operation.

during the second active section ② of the active mode, the second pull-up driving module N2 may drive the pull-up power line RTO to the core voltage VCORE in response to the second pull-up driving signal SAP2, and the pull-down driving module N3 may drive the pull-down power line SB to the ground voltage VSS in response to the pull-down driving signal SAN. Then, the sense amplifier 120 may maintain the voltage level of the positive bit-line BL at the core voltage VCORE and maintain the voltage level of the negative bit-line BLB at the ground voltage VSS.

During the third active section ③ of the active mode the first pull-up driving module N1 may drive the pull-up power line RTO to the power supply voltage VDD in response to the first pull-up driving signal SAP1, and the pull-down driving module N3 may drive the pull-down power line SB to the ground voltage VSS in response to the pull-down driving signal SAN. Then, the sense amplifier 120 may amplify the voltage level of the positive bit-line BL to the power supply voltage VDD, and maintain the voltage level of the negative bit-line BLB at the ground voltage VSS. In other words, the sense amplifier 120 may perform an over-driving operation for the third active section.

Thereafter, the first precharge unit 150 may precharge the bit-line pair BL and BLB to the bit-line precharge voltage VBLP in the precharge mode, and the second precharge unit 160 may precharge the pull-up power line RTO and the pull-down power line SB to the bit-line precharge voltage VBLP in the precharge mode.

According to the comparative example of the present invention, since data of a logic high level corresponding to the power supply voltage VDD is transferred to the cell capacitor at a time just before the memory cell 110 is inactivated, i.e. for the third active section of the active mode, a data retention time may be improved when the memory cell 110 is inactive, i.e. for the precharge mode. In addition, according to the comparative example of the present invention, although it is not shown in FIGS. 1 to 3, when a write operation is performed for the second active section of the active mode, a write time required to transfer write data to the memory cell 110 is improved due to the over-driving operation for the third active section of the active mode.

However, according to the semiconductor memory device in accordance with the comparative example of the present invention, as shown in FIG. 3, the precharge time required to precharge the bit-line pair BL and BLB to the bit-line precharge voltage VBLP is longer. In addition, since the voltage level of the positive bit-line BL is amplified to the power supply voltage VDD due to the over-driving operation for the third active section of the active mode, the bit-line pair BL and BLB is not accurately precharged to the voltage level of the bit-line precharge voltage VBLP, which is an intermediate level of the core voltage VCORE and the ground voltage VSS. Therefore, according to the semiconductor memory device in accordance with the comparative example of the present invention, the precharge time (tRP) becomes longer, and noise occurs in the bit-line precharge voltage VBLP in the precharge mode.

Figure 4:
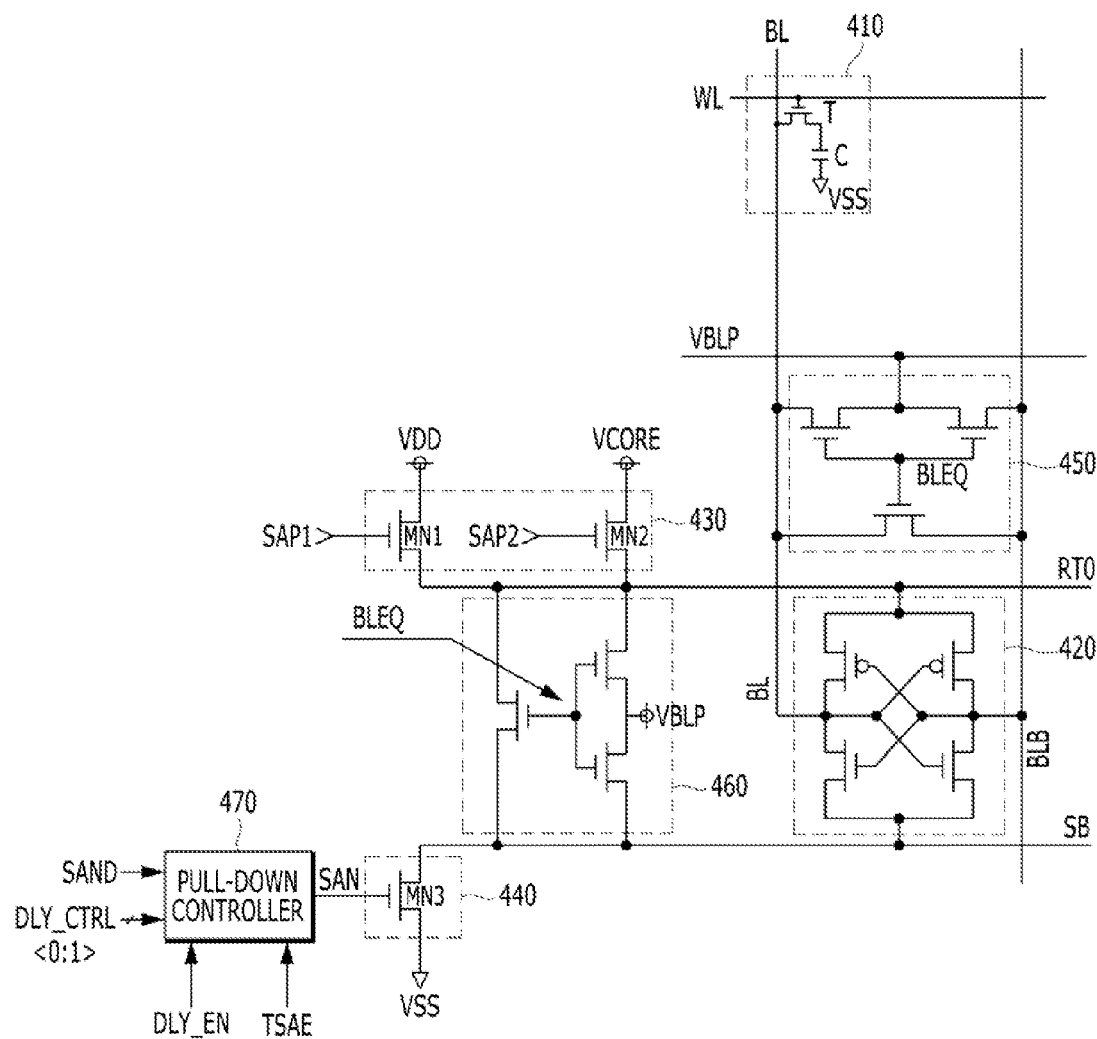
FIG. 4 is a circuit diagram illustrating a semiconductor memory device in accordance with an embodiment of the present invention.

FIG. 4 is a circuit diagram illustrating a semiconductor memory device in accordance with an embodiment of the present invention.

Referring to FIG. 4, the semiconductor memory device includes a bit-line pair BL and BLB including a positive bit-line BL and a negative bit-line BLB, a memory cell 410, a sense amplifier 420, a pull-up driving unit 430, a pull-down driving unit 440, a first precharge unit 450, a second precharge unit 460, and a pull-down controller 470.

The memory cell 410 may be connected to any one of the positive bit-line BL and the negative bit-line BLB, and may include a cell capacitor C for storing data, and a cell transistor T for controlling charge sharing between the cell capacitor C and either the positive bit-line BL or the negative bit-line BLB. For example, the cell capacitor C may include a capacitor connected between a ground voltage (VSS) terminal and a storage node. The cell transistor T may include an NMOS transistor which has a gate connected to a word line WL, and has a source and a drain connected between the storage node and the positive bit-line BL.

The sense amplifier 420 is configured to include a normal bit-line sense amplifier, which may sense and amplify data loaded on the bit-line pair BL and BLB to a driving voltage supplied through a pull-up power line RTO and a pull-down power line SB. For example, the sense amplifier 420 may include a cross-coupled latch amplifier.

The pull-up driving unit 430 may include a first pull-up driving module MN1 and a second pull-up driving module MN2. The first pull-up driving module MN1 may drive the pull-up power line RTO to a power supply voltage VDD for a first active section and a third active section of an active mode in response to a first pull-up driving signal SAP1. The first active section may correspond to a part of an initial section of the active mode, and the third active section may correspond to a section just before exiting from the active mode. In addition, the second pull-up driving module MN2 may drive the pull-up power line RTO to a core voltage VCORE for a second active section of the active mode, between the first active section and the third active section of the active mode, in response to a second pull-up driving signal SAP2. The first pull-up driving module MN1 may include a first NMOS transistor having a gate receiving the first pull-up driving signal SAP1 and a source and a drain connected between a power supply voltage (VDD) terminal and the pull-up power line RTO. The second pull-up driving module MN2 may include a second NMOS transistor having a gate receiving the second pull-up driving signal SAP2 and a source and a drain connected between a core voltage (VCORE) terminal and the pull-up power line RTO.

The pull-down driving unit 440 may include a pull-down driving module MN3. The pull-down driving module MN3 may drive the pull-down power line SB to a ground voltage VSS, in response to a pull-down driving signal SAN, for the first to third active sections of the active mode and for an initial section of a precharge mode after the active mode. The pull-down driving module MN3 may include a third NMOS transistor having a gate receiving the pull-down driving signal SAN and a source and a drain connected between the ground voltage (VSS) terminal and the pull-down power line SB.

The pull-down controller 470 may control an activation section of the pull-down driving signal SAN to be activated for the first to third active sections of the active mode and for an initial section of a precharge mode. The pull-down controller 470 may delay an inactivation timing of an initial pull-down driving signal SAND by a delay amount in response to a plurality of delay control signals DLY_CTRL<0:1>, and output the pull-down driving signal SAN in response to a delay enable signal DLY_EN and a sense amplifier enable test signal TSAE. The delay control signals DLY CTRL<0:1> may be a signal transmitted from outside, to control the pull-down driving signal SAN to be maintained in an activation state for the initial section of the precharge mode after the active mode.

The first precharge unit 450 may precharge the bit-line pair BL and BLB to a bit-line precharge voltage VBLP for the remaining section of the precharge mode, other than the initial section, in response to an equalization signal BLEQ.

The second precharge unit 460 may precharge the pull-up power line RTO and the pull-down power line SB to the bit-line precharge voltage VBLP for the remaining section of the precharge mode, other than the initial section, in response to the equalization signal BLEQ.

For reference, the core voltage VCORE and the bit-line precharge voltage VBLP may be internal voltages which are internally generated based on the power supply voltage VDD applied from the outside. For example, the core voltage VCORE may be generated by lowering the power supply voltage VDD, and the bit-line precharge voltage VBLP may be generated by lowering the core voltage VCORE, e.g., VBLP=VCORE/2. Therefore, the bit-line precharge voltage VBLP may have a voltage level lower than the core voltage VCORE, and the core voltage VCORE may have a voltage level lower than the power supply voltage VDD.

Figure 5:
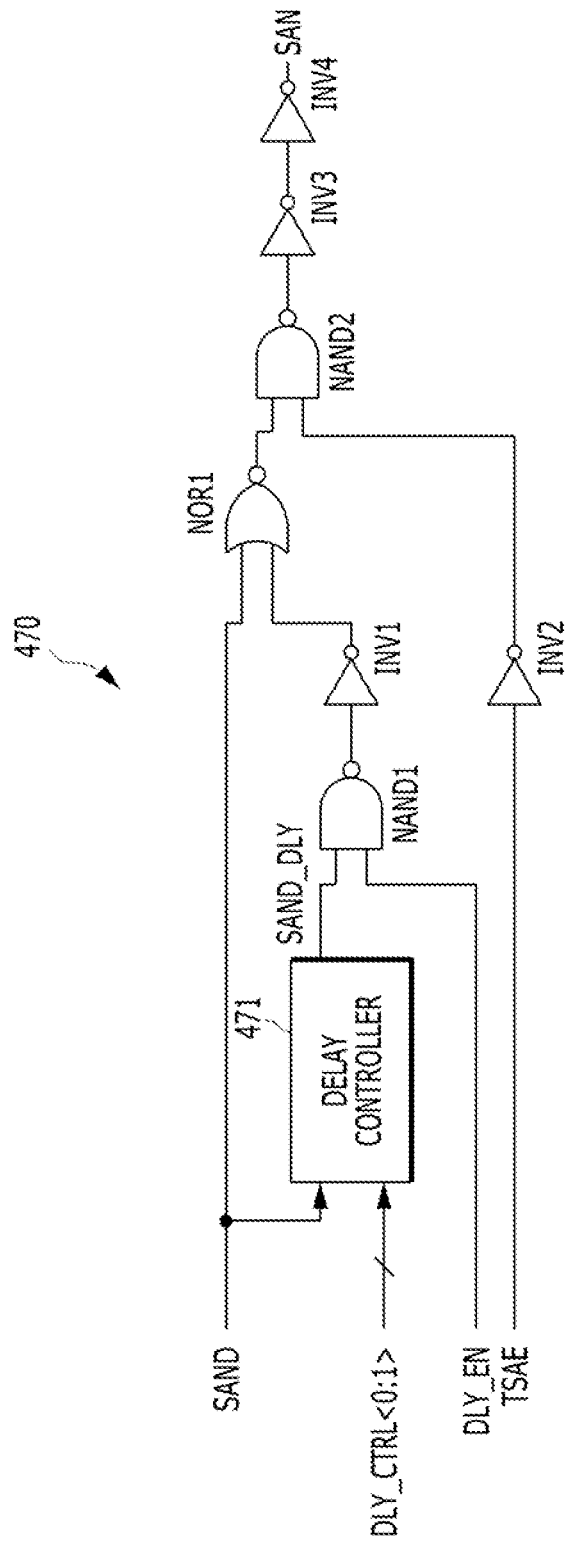
FIG. 5 is a circuit diagram illustrating a pull-down controller shown in FIG. 4.

FIG. 5 is a circuit diagram illustrating the pull-down controller 470 shown in FIG. 4.

Referring to FIG. 5, the pull-down controller 470 may include a delay controller 471 and a plurality of combinational logic circuits.

The delay controller 471 may generate a delayed signal SAND_DLY in response to the initial pull-down driving signal SAND and the plurality of delay control signals DLY_CTRL<0:1>. The delay controller 471 may generate the delayed signal SAND_DLY by delaying the initial pull-down driving signal SAND by the delay amount in response to the delay control signals DLY_CTRL<0:1>. The delay amount of delay may be controlled in response to the delay control signals DLY_CTRL<0:1>.

The plurality of combinational logic circuits may include first and second NAND gates NAND1 and NAND2, first and second NOR gates NOR1 and NOR2, and first to fourth inverters INV1, INV2, INV3 and INV4.

The first NAND gate NAND1 performs a NAND operation on a delay enable signal DLY_EN and the delayed signal SAND_DLY outputted from the delay controller 471. The first inverter INV1 inverts an output signal of a first NAND gate NAND1, and the first NOR gate NOR1 performs a NOR operation on the initial pull-down driving signal SAND and an output signal of the first inverter INV1. The second inverter INV2 inverts the sense amplifier enable test signal TSAE, and the second NAND gate NAND2 performs a NAND operation on an output signal of the first NOR gate NOR1 and an output signal of the second inverter INV2. The sense amplifier enable test signal TSAE may be enabled only for a test operation of the sense amplifier 420. The third and fourth inverters INV3 and INV3 buffer an output signal of the second NAND gate NAND2 and output the pull-down driving signal SAN.

The pull-down driving signal SAN outputted through the delay controller 471 and the plurality of combinational logic circuits, as described above, may have an activation section which is longer than that of the initial pull-down driving signal SAND by a predetermined period of time. The pull-down driving signal SAN may have an activation section from the first active section of the active mode to the initial section of the precharge mode.

Although it is not shown in FIG. 5, the delay controller 471 may be implemented with a relay delay circuit, not an inverter delay circuit. This is because the inverter delay circuit has a large skew that depends on process, voltage and temperature (PVT) conditions. Therefore, the relay delay circuit may be used to obtain an accurate delay operation that is as long as desired.

Hereinafter, an operation of the semiconductor memory device as shown in FIGS. 4 and 5 in accordance with the embodiment of the present invention will be described with reference to FIGS. 6 and 7.

Figure 6:
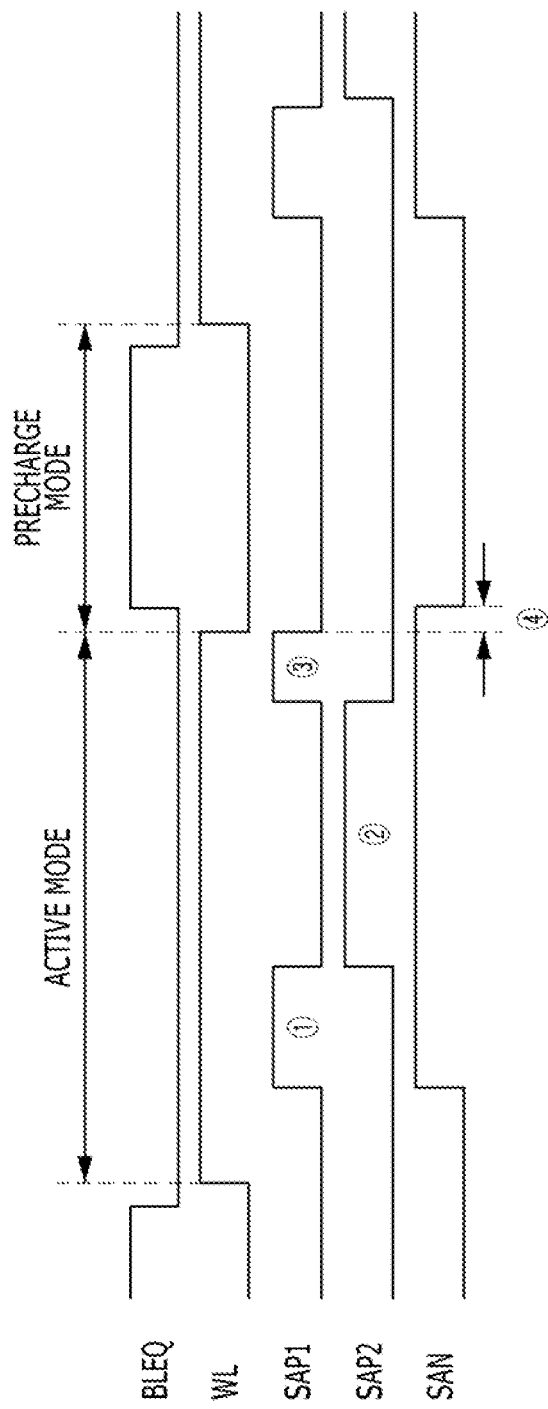
FIG. 6 is a timing diagram showing an operation of the semiconductor memory device illustrated in FIG. 4.
Figure 7:
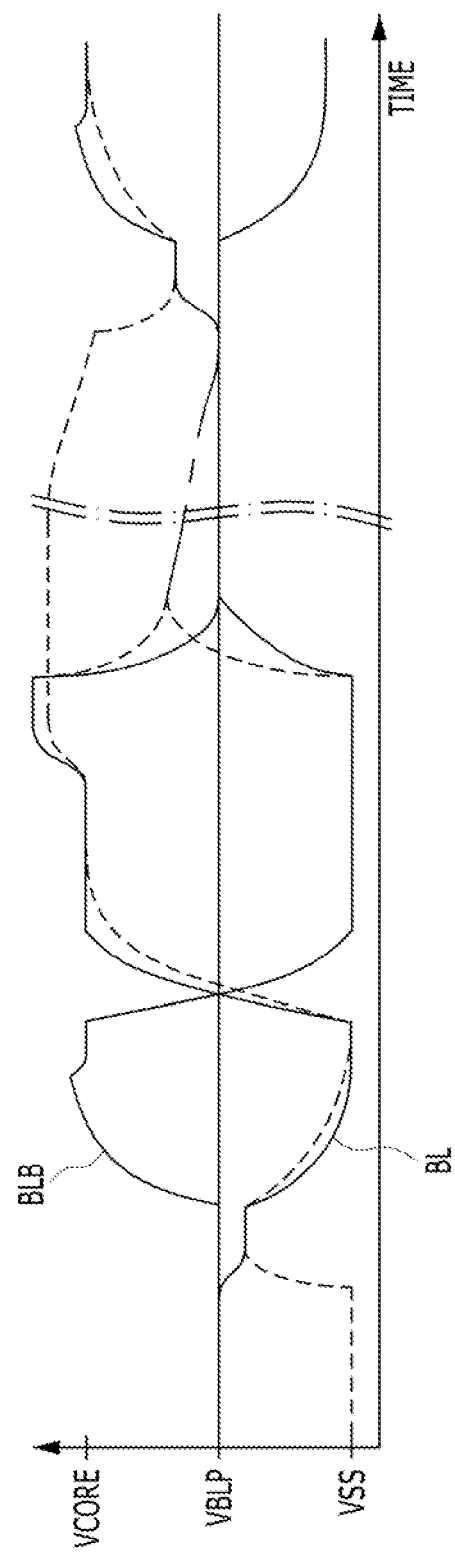
FIG. 7 is a waveform diagram showing a change in a voltage level of a bit-line pair according to the operation of FIG. 6.

FIG. 6 is a timing diagram showing the operation of the semiconductor memory device in accordance with an embodiment of the present invention, and FIG. 7 is a waveform diagram showing a change in a voltage level of the bit-line pair BL and BLB according to the operation of FIG. 6.

Referring to FIGS. 6 and 7, the word line WL may be activated to a logic high level for the active mode, and may be inactivated to a logic low level for the precharge mode. For example, the word line WL may be activated in response to an active command (not shown), and may be inactivated in response to a precharge command (not shown).

In addition, the first pull-up driving signal SAP1 may be activated for the first active section ① of the active mode, corresponding to a section after a predetermined period of time from an activation timing of the word line WL, and the second pull-up driving signal SAP2 may be activated for the second active section ② of the active mode when the first pull-up driving signal SAP1 is inactivated. Thereafter, the first pull-up driving signal SAP1 may be activated for the third active section ③ of the active mode when the second pull-up driving signal SAP2 is inactivated. In addition, the pull-down driving signal SAN may be continuously activated for the first to third active sections of the active mode and for the initial section ④ of the precharge mode. The first and second pull-up driving signals SAP1 and SAP2 and the pull-down driving signal SAN may be generated by a combination of the active command and the precharge command.

Meanwhile, in the memory cell 410, when the cell transistor T is turned on in the active mode, charge sharing between the positive bit-line BL and the cell capacitor C is achieved before the first active section ① of the active mode. When the cell capacitor C has stored data of a logic high level, a voltage of the positive bit-line BL increases by a preset voltage level from the voltage level of the bit-line precharge voltage VBLP. Therefore, a preset voltage difference occurs between the positive bit-line BL and the negative bit-line BLB.

In this state, during the first active section ① of the active mode, the first pull-up driving module MN1 may drive the pull-up power line RTO to the power supply voltage VDD in response to the first pull-up driving signal SAP1, and the pull-down driving module MN3 may drive the pull-down power line SB to the ground voltage VSS in response to the pull-down driving signal SAN. Then, the sense amplifier 420 may perform an over-driving operation which is performed by the power supply voltage VDD having a higher level than a target voltage, e.g. the core voltage VCORE, and the ground voltage VSS for an initial operation section, the first active section of the active mode.

During the second active section ② of the active mode, the second pull-up driving module MN2 may drive the pull-up power line RTO to the core voltage VCORE in response to the second pull-up driving signal SAP2, and the pull-down driving module MN3 may drive the pull-down power line SB to the ground voltage VSS in response to the pull-down driving signal SAN. Then, the sense amplifier 420 may maintain the voltage level of the positive bit-line BL at the core voltage VCORE and maintain the voltage level of the negative bit-line BLB at the ground voltage VSS.

During the third active section ③ of the active mode the first pull-up driving module MN1 may drive the pull-up power line RTO to the power supply voltage VDD in response to the first pull-up driving signal SAP1, and the pull-down driving module MN3 may drive the pull-down power line SB to the ground voltage VSS in response to the pull-down driving signal SAN. Then, the sense amplifier 420 may amplify the voltage level of the positive bit-line BL to the power supply voltage VDD, and may maintain the voltage level of the negative bit-line BLB at the ground voltage VSS. In other words, the sense amplifier 420 performs an over-driving operation for the third active section of the active mode.

Subsequently, the pull-down driving module MN3 may maintain the voltage level of the negative bit-line BLB at the ground voltage VSS for the initial section ④ of the precharge mode after the over-driving operation for the third active section of the active mode is finished. Accordingly, noise occurring in the bit-fine precharge voltage VBLP may be reduced.

Thereafter, the first precharge unit 450 may precharge the bit-line pair BL and BLB to the bit-line precharge voltage VBLP for the remaining section of the precharge mode as the equalization signal BLEQ is activated, and the second precharge unit 460 may precharge the pull-up power line RTO and the pull-down power line SB to the bit-line precharge voltage VBLP for the remaining section of the precharge mode as the equalization signal BLEQ is activated.

According to the embodiment of the present invention, data of a logic high level corresponding to the power supply voltage VDD is transferred to the cell capacitor C just before the memory cell 410 is inactivated, i.e. for the third active section of the active mode, a data retention time may be improved when the memory cell 410 is inactivated, i.e. for the entire section of the precharge mode. In addition, according to an embodiment of the present invention, although it is not shown in FIGS. 4 to 7, when a write operation is performed for the second active section of the active mode, a write time required to transfer write data to the memory cell 410 is improved due to the over-driving operation for the third active section of the active mode. Finally, in accordance with the embodiment of the present invention, the pull-down driving signal SAN is maintained in an activated state for the initial section of the precharge mode after the over-driving operation for the third active section of the active mode, as shown in FIG. 7, so that operation current may be controlled to flow to the ground voltage VSS. Therefore, the bit-line pair BL and BLB may be accurately precharged to the voltage level of the bit-line precharge voltage VBLP, which is an intermediate level of the core voltage VCORE and the ground voltage VSS. Thus, compared with the aforementioned comparative example shown in FIGS. 1-3, according to an embodiment of the present invention, there is an advantage in that noise occurring in the bit-line precharge voltage VBLP in the precharge mode may be reduced/minimized while the precharge time (tRP) is improved.

Figure 8:
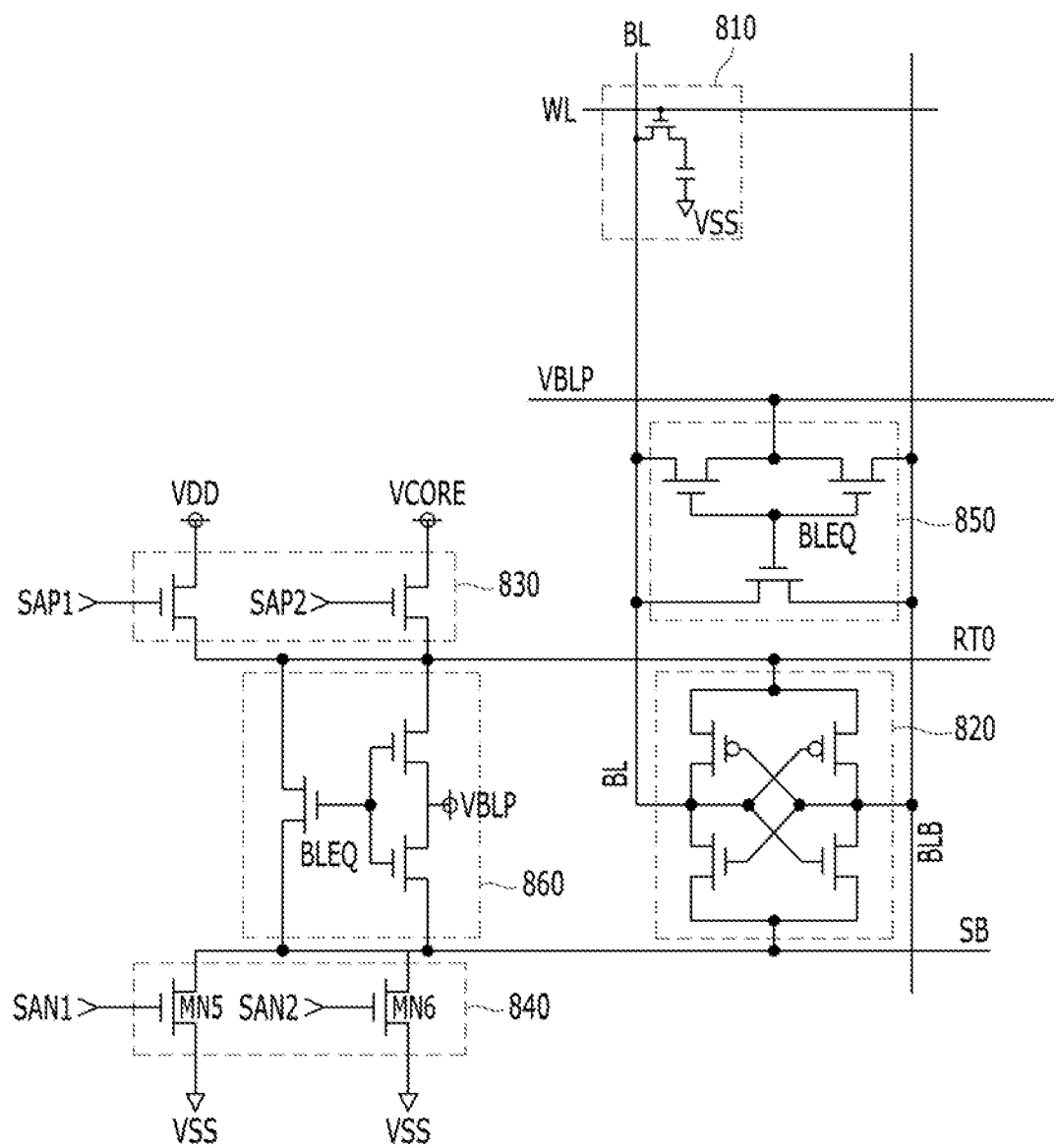
FIG. 8 is a circuit diagram illustrating a semiconductor memory device in accordance with another embodiment of the present invention.

FIG. 8 is a circuit diagram illustrating a semiconductor memory device in accordance with another embodiment of the present invention.

Referring to FIG. 8, the semiconductor memory device may include a bit-line pair BL and BLB including a positive bit-line BL and a negative bit-line BLB, a memory cell 810, a sense amplifier 820, a pull-up driving unit 830, a pull-down driving unit 840, a first precharge unit 850, and a second precharge unit 860.

The configurations of the memory cell 810, the sense amplifier 820, the pull-up driving unit 830, the first precharge unit 850, and a second precharge unit 860 may correspond to the configurations of the memory cell 410, the sense amplifier 420, the pull-up driving unit 430, the first precharge unit 450, and a second precharge unit 460, respectively, of the semiconductor memory device, which is shown in FIG. 4. Therefore, a detailed description thereof will be omitted.

The pull-down driving unit 840 may include a first pull-down driving module MN5 and a second pull-down driving module MN6. The first pull-down driving module MN5 may drive a pull-down power line SB to a ground voltage VSS for first to third active sections of an active mode in response to a first pull-down driving signal SAN1, and the second pull'-down driving module MN6 may drive the pull-down power line SB to the ground voltage VSS for an initial section of a precharge mode in response to a second pull-down driving signal SAN2. For example, the first pull-down driving module MN5 may include a third NMOS transistor having a gate receiving, the first pull-down driving signal SAN1 and a source and a drain connected between a ground voltage (VSS) terminal and the pull-down power line SB, and the second pull-down driving module MN6 may include a fourth NMOS transistor having a gate receiving the second pull-down driving signal SAN2 and a source and a drain connected between the ground voltage (VSS) terminal and the pull-down power line SB.

Hereinafter, an operation of the semiconductor memory device shown in FIG. 8 in accordance with the embodiment of the present invention will be described with reference to FIG. 9.

Figure 9:
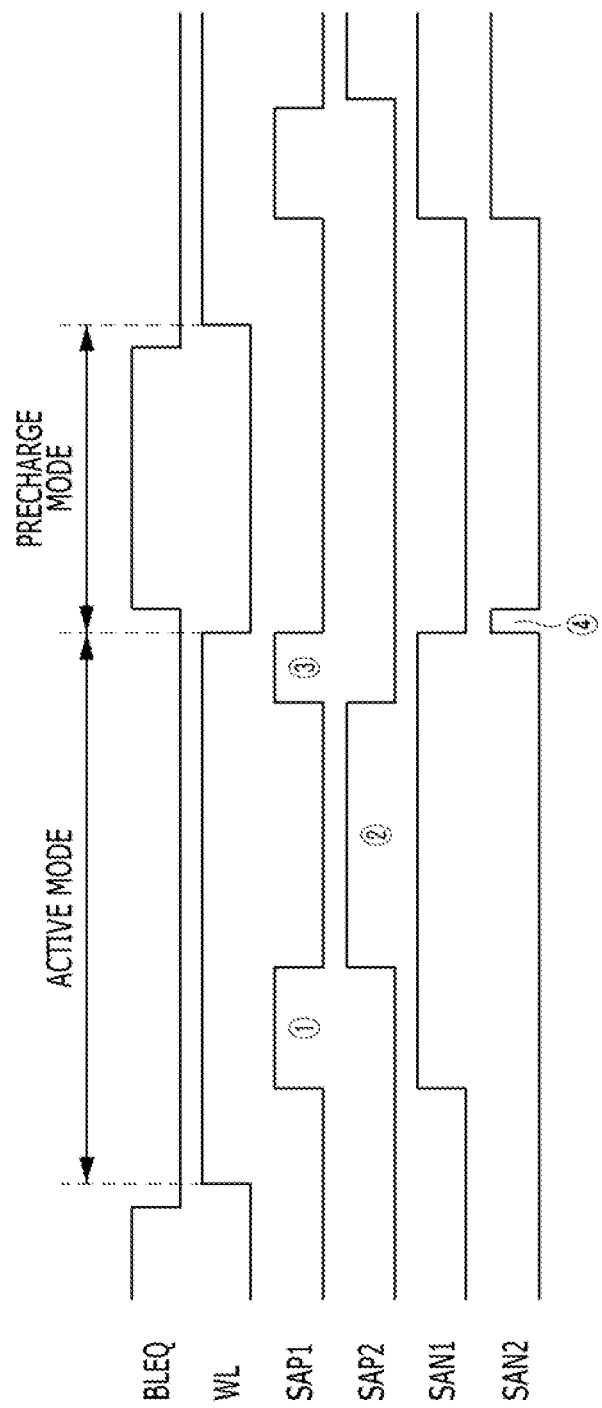
FIG. 9 is a timing diagram showing an operation of the semiconductor memory device illustrated in FIG. 8.

FIG. 9 is a timing diagram showing the operation of the semiconductor memory device illustrated in FIG. 8.

Referring to FIG. 9, the second pull-down driving module MN6 may drive the pull-down power line SB to the ground voltage VSS in response to the second pull-down driving signal SAN2, which is activated for the initial section ④ of a precharge mode. According to FIG. 6, which illustrates the operation of the semiconductor memory device of FIG. 4, the pull-down driving signal SAN may be controlled, by the pull-down controller 470, to maintain an activated state for the initial section of the precharge mode and then to be inactivated for the remaining section of the precharge mode. In contrast, according to FIG. 9 which illustrates the operation of the semiconductor memory device of FIG. 8, the second pull-down driving signal SAN2 may be activated to drive the pull-down power line SB to the ground voltage VSS for the initial section of the precharge mode. In the semiconductor memory device of FIG. 8, for the third active section of the active mode, the sense amplifier 820 may amplify a voltage level of the positive bit-line BL to a power supply voltage VDD, and may maintain a voltage level of the negative bit-line BLB at the ground voltage VSS. In other words the sense amplifier 820 may perform an over-driving operation for the third active section of the active mode, and maintain the voltage level of the negative bit-line BLB at the ground voltage VSS for the initial section of the precharge mode after the over-driving operation for the third active section of the active mode is finished.

While the semiconductor memory device illustrated in FIG. 4 maintains the voltage level of the negative bit-line BLB at the ground voltage VSS for the initial section in a precharge mode by controlling the activation section of the pull-down driving signal SAN through the pull-down controller 470, the semiconductor memory device illustrated in FIG. 8 additionally includes the second pull-down driving module MN6 and maintains the voltage level of the negative bit-line BLB at the ground voltage VSS for the initial section of the precharge mode in response to the second pull-down driving signal SAN2, thereby reducing noise which occurs in the bit-line precharge voltage VBLP. Therefore, a change in the voltage level of the bit-line pair BL and BLB according to the operation description of FIG. 9 is substantially the same as a change in the voltage level of the bit-line pair BL and BLB according to the operation description of FIG. 7.

In addition, the semiconductor memory device shown in FIG. 8, in accordance with another embodiment of the present invention, may have substantially the same advantages as the semiconductor memory device illustrated in FIG. 4, in accordance with an embodiment of the present invention.

In another embodiment, the second pull-down driving module MN6 shown in FIG. 8 may be connected between a bit-line precharge voltage (VBLP) terminal and the ground voltage (VSS) terminal, not between a pull-down power line (SB) terminal and the ground voltage (VSS) terminal, so as to connect the bit-line precharge voltage (VBLP) terminal with the ground voltage (VSS) terminal for an activation time of the second pull-down driving signal SAN2, e.g. for the initial section of the precharge mode. Accordingly, the same advantages as described above may be obtained.

According to the semiconductor memory device in accordance with the embodiments of the present invention, as the data retention time is improved, the refresh cycle may be improved so that the performance of the refresh operation may be improved.

In addition, as the precharge time (tRP) is improved, noise reflected onto a precharge voltage used in a precharge mode may be minimized so that the performance of the precharge operation may be improved.

In addition, as the write time required to transfer write data is improved, the time (tWR) during which a precharge command may be applied may be improved, so that the data write performance may be improved.

Although various embodiments have been described for illustrative purposes, it will be apparent to those skilled in the art that various changes and modifications may be made without departing from the spirit and scope of the invention as defined in the following claims.

What is claimed is:
1. A semiconductor memory device comprising:
a sense amplifier capable of sensing and amplifying data loaded on a data-line pair based on a pull-up driving voltage and a pull-down driving voltage;

a pull-up driving unit capable of supplying a first voltage as the pull-up driving voltage for first and third active sections of an active mode, and supplying a second voltage having a voltage level lower than the first voltage as the pull-up driving voltage for a second active section of the active mode, between the first and third active sections of the active mode; and a pull-down driving unit capable of supplying a third voltage as the pull-down driving voltage for the first to third active sections of the active mode and for an initial section of a precharge mode after the active mode, wherein the pull-up driving unit is disabled during the initial section of the precharge mode while the third voltage is supplied.

2. The semiconductor memory device of claim 1, wherein the pull-down driving unit comprises:

a pull-down controller capable of controlling an activation section of a pull-down driving signal to be activated for the first to third active sections of the active mode and for the initial section of the precharge mode; and a pull-down driving module capable of supplying the third voltage as the pull-down driving voltage in response to the pull-down driving signal.

3. The semiconductor memory device of claim 1, wherein the pull-down driving unit comprises:

a first pull-down driving module capable of supplying the third voltage as the pull-down driving voltage for the first to third active sections of the active mode; and a second pull-down driving module capable of supplying the third voltage as the pull-down driving voltage for the initial section of the precharge mode.

4. The semiconductor memory device of claim 1, wherein the pull-up driving unit comprises:

a first pull-up driving module capable of supplying the first voltage as the pull-up driving voltage for the first and third active sections of the active mode; and a second pull-up driving module capable of supplying the second voltage as the pull-up driving voltage for the second active section of the active mode.

5. The semiconductor memory device of claim 1, further comprising:

a first precharge unit capable of recharging the data-line pair to a precharge voltage for a section of the precharge mode other than the initial section of the precharge mode; and a second precharge unit capable of recharging a pull-up power line through which the pull-up driving voltage is supplied, and a pull-down power line through which the pull-down driving voltage is supplied, to the precharge voltage for the section of the precharge mode other than the initial section of the precharge mode.

6. The semiconductor memory device of claim 5, wherein the precharge voltage has a voltage level that is approximately half of the second voltage.

7. The semiconductor memory device of claim 1, wherein the first voltage is a power supply voltage supplied from outside, the second voltage is a core voltage generated by lowering the power supply voltage, and the third voltage is a ground voltage.

8. A semiconductor memory device comprising:

a bit-line pair comprising a positive bit-line and a negative bit-line;

a memory cell connected to either the positive bit-line and the negative bit-line;

a sense amplifier capable of sensing and amplifying data loaded on the bit-line pair based on a pull-up driving voltage and a pull-down driving voltage;

a pull-up driving unit capable of supplying a first voltage as the pull-up driving voltage for first and third active sections of the active mode, and supplying a second voltage having a voltage level lower than the first voltage as the pull-up driving voltage for a second active section of the active mode, between the first and third active sections of the active mode; and a pull-down driving unit capable of supplying a third voltage as the pull-down driving voltage for the first to third active sections of the active mode and for an initial section of a precharge mode after the active mode, wherein the pull-up driving unit is disabled during the initial section of the precharge mode while the third voltage is supplied.

9. The semiconductor memory device of claim 8, wherein the pull-down driving unit comprises:

a pull-down controller capable of controlling an activation section of a pull-down driving signal to be activated for the first to third active sections of the active mode and for the initial section of the precharge mode; and a pull-down driving module capable of supplying the third voltage as the pull-down driving voltage in response to the pull-down driving signal.

10. The semiconductor memory device of claim 8, wherein the pull-down driving unit comprises:

a first pull-down driving module capable of supplying the third voltage as the pull-down driving voltage for the first to third active sections of the active mode; and a second pull-down driving module capable of supplying the third voltage as the pull-down driving voltage for the initial section of the precharge mode.

11. The semiconductor memory device of claim 8, wherein the pull-up driving unit comprises:

a first pull-up driving module capable of supplying the first voltage as the pull-up driving voltage for the first and third active sections of the active mode; and a second pull-up driving module capable of supplying the second voltage as the pull-up driving voltage for the second active section of the active mode.

12. The semiconductor memory device of claim 8, further comprising:

a first precharge unit capable of recharging the bit-line pair to a precharge voltage for a section of the precharge mode other than the initial section of the precharge mode; and a second precharge unit capable of recharging a pull-up power line through which the pull-up driving voltage is supplied, and a pull-down power line through which the pull-down driving voltage is supplied, to the precharge voltage for the section of the precharge mode other than the initial section of the precharge mode.

13. The semiconductor memory device of claim 12, wherein the precharge voltage has a voltage level that is approximately half of the second voltage.

14. The semiconductor memory device of claim 8, wherein the first voltage is a power supply voltage supplied from outside, the second voltage is a core voltage generated by lowering the power supply voltage, and the third voltage is a ground voltage.

15. A semiconductor memory device comprising:

a sense amplifier capable of sensing and amplifying data loaded on a data-line pair based on a pull-up driving voltage and a pull-down driving voltage;

a pull-up driving unit capable of supplying a core voltage as the pull-up driving voltage for an active section, and supplying an over-driving voltage as the pull-up driving voltage one or more times during the active section, just before a precharge section; and a pull-down driving unit capable of supplying a ground voltage as the pull-down driving voltage for the active section and for an initial section of the precharge section, wherein the pull-up driving unit is disabled during the initial section of the precharge mode while the ground voltage is supplied.

16. The semiconductor memory device of claim 15, wherein the pull-down driving unit comprises:

a pull-down controller capable of controlling an activation section of a pull-down driving signal to be activated for the active section and for the initial section of the precharge section; and a pull-down driving module capable of supplying the ground voltage as the pull-down driving voltage in response to the pull-down driving signal.

17. The semiconductor memory device of claim 15, wherein the pull-down driving unit comprises:

a first pull-down driving module capable of supplying the ground voltage as the pull-down driving voltage for the active section; and a second pull-down driving module capable of supplying the ground voltage as the pull-down driving voltage for the initial section of the precharge section.

18. The semiconductor memory device of claim 15, wherein the pull-up driving unit comprises:

a first pull-up driving module capable of supplying the over-driving voltage as the pull-up driving voltage for first and third active periods of the active section; and a second pull-up driving module capable of supplying the core voltage as the pull-up driving voltage for a second active period of the active section, between the first and second active periods.

19. The semiconductor memory device of claim 15, further comprising:

a first precharge unit capable of recharging the data-line pair to a precharge voltage for a section of the precharge section other than the initial section of the precharge section; and a second precharge unit capable of recharging a pull-up power line through which the pull-up driving voltage is transferred, and a pull-down power line through which the pull-down driving voltage is transferred, to the precharge voltage for the section of the precharge section other than the initial section of the precharge section.

20. The semiconductor memory device of claim 19, wherein the precharge voltage has a voltage level that is approximately half of the core voltage.

* * * * *